(12) United States Patent
Delpierre et al.

(10) Patent No.: US 11,175,496 B2
(45) Date of Patent: Nov. 16, 2021

(54) DISPLAY

(71) Applicant: VALEO COMFORT AND DRIVING ASSISTANCE, Créteil (FR)

(72) Inventors: Laurent Delpierre, Creteil (FR); Patrick Corduan, Creteil (FR); François Grandclerc, Créteil (FR)

(73) Assignee: VALEO COMFORT AND DRIVING ASSISTANCE, Créteil (FR)

( * ) Notice: Subject to any disclaimer, the term of this patent is extended or adjusted under 35 U.S.C. 154(b) by 355 days.

(21) Appl. No.: 16/096,846

(22) PCT Filed: Apr. 25, 2017

(86) PCT No.: PCT/EP2017/059836
§ 371 (c)(1),
(2) Date: Mar. 5, 2019

(87) PCT Pub. No.: WO2017/186744
PCT Pub. Date: Nov. 2, 2017

(65) Prior Publication Data
US 2019/0179141 A1 Jun. 13, 2019

(30) Foreign Application Priority Data

Apr. 26, 2016 (FR) ..................... 1653671

(51) Int. Cl.
*G02B 27/01* (2006.01)
*H05K 1/02* (2006.01)
*H05K 1/05* (2006.01)

(52) U.S. Cl.
CPC ....... *G02B 27/0101* (2013.01); *H05K 1/0274* (2013.01); *H05K 1/056* (2013.01);
(Continued)

(58) Field of Classification Search
CPC ........ G02B 27/0172; G02B 2027/0178; G02B 27/0176; G02B 27/0101;
(Continued)

(56) References Cited

U.S. PATENT DOCUMENTS 6,100,943 A * 8/2000 Koide .................... B60K 37/02
349/11
2005/0162738 A1* 7/2005 Kanamori ......... G02F 1/133615
359/460
(Continued)

FOREIGN PATENT DOCUMENTS

JP H06-144081 A * 5/1994 ............. B60K 35/00
JP 2016-000590 A 1/2016
(Continued)

OTHER PUBLICATIONS

International Search Report issued in PCT/EP2017/059836 dated Jul. 6, 2017 (2 pages).
(Continued)

*Primary Examiner* — William R Alexander
*Assistant Examiner* — Sharrief I Broome
(74) *Attorney, Agent, or Firm* — Osha Bergman Watanabe & Burton LLP

(57) ABSTRACT

The invention relates to a display (1) comprising: an image generation unit comprising at least one light emitter (23), a printed circuit support plate (22), on which said emitter (23) is mounted, and a light sensor (30) capable of delivering a signal representative of a light intensity received by same, the display (1) being adapted in such a way that the luminosity of an image generated by the image generation unit is controlled as a function of said signal. According to invention, the light sensor (30) is mounted on said printed circuit support plate (22).

12 Claims, 2 Drawing Sheets

(52) U.S. Cl.
CPC ............... *G02B 2027/0118* (2013.01); *H05K 2201/10106* (2013.01)

(58) Field of Classification Search
CPC .... G02B 2027/0118; G02B 2027/0138; G02B 27/017; G02B 2027/014; G02B 27/0093; G02B 5/30; G02B 2027/015; G02B 27/01; G02B 27/0149; G02B 2027/0123; G02B 2027/0154; G02B 2027/013; G02B 2027/0127; G02B 2027/0159; G02B 2027/011; G02B 2027/0169; G06F 3/013; G06F 3/017; G06F 1/163; G06F 3/011; G06F 3/012; G06F 3/005; G06F 3/03545; G06F 3/04883; G06F 5/10; G06F 1/203; G06F 1/206; G06F 3/016; G06F 3/0317; G06F 3/036; B32B 2037/1253; B32B 2307/416; B32B 2307/42; B32B 2551/00; B32B 2551/08; B32B 37/1284; B32B 37/24; B32B 38/0008; B32B 17/061; H04N 13/344; H04N 5/332; H04N 5/33; H04N 5/64; H04N 13/122; H04N 13/194; H04N 13/239; H04N 13/275; H04N 13/279; H04N 13/30; H04N 13/332; H04N 13/349; H04N 1/6083; H04N 2213/003; H04N 5/2252; H04N 5/7491; H04N 9/3135; H04N 9/3147; H04N 9/3155; H04N 9/3161; G09G 3/3208; G09G 2310/0235; G09G 2320/0626; G09G 2340/0471; G09G 2340/0478; G09G 2360/144; G09G 3/2003; G09G 3/3225; G09G 3/3233; G09G 3/36; G09G 2300/0478; G09G 2310/08; G09G 2320/0252; G09G 2320/041; G09G 2320/10; G09G 2340/0407; G09G 3/001; G09G 3/002; G09G 3/18; G09G 3/32

See application file for complete search history.

(56) References Cited

U.S. PATENT DOCUMENTS

| | | | |
|---|---|---|---|
| 2010/0046082 A1* | 2/2010 | Croy | G02B 27/0149 359/632 |
| 2013/0113973 A1* | 5/2013 | Miao | G09G 3/003 348/333.01 |
| 2015/0116192 A1* | 4/2015 | Yachida | H05B 47/11 345/84 |
| 2015/0286053 A1* | 10/2015 | Hu | G02B 27/0101 349/11 |
| 2016/0178900 A1* | 6/2016 | Kawaguchi | G02B 27/0149 250/215 |
| 2019/0059163 A1* | 2/2019 | Rieger | H05K 3/22 |

FOREIGN PATENT DOCUMENTS

| | | | | |
|---|---|---|---|---|
| WO | 2014/208438 A1 | 12/2014 | | |
| WO | WO-2014208438 A1 * | 12/2014 | ............ | G02B 27/01 |

OTHER PUBLICATIONS

Written Opinion of the International Searching Authority issued in PCT/EP2017/059836 dated Jul. 6, 2017 (7 pages).

* cited by examiner

DISPLAY

TECHNICAL FIELD OF THE INVENTION

The present invention relates to a display, particularly a head-up display for a motor vehicle.

More specifically, it relates to a display comprising:

an image generation unit comprising at least one light emitter;

a printed circuit support plate, on which said emitter is mounted; and a light sensor capable of delivering a signal representing a light intensity received thereby;

the display being adapted so that the luminosity of an image generated by the image generation unit is controlled as a function of said signal.

TECHNOLOGICAL BACKGROUND

For the driver of a motor vehicle, it is particularly convenient to be able to view information relating to the operation of the vehicle, the status of traffic or other types of information, without having to avert their view from the road in front of the vehicle to this end.

For this purpose, equipping a motor vehicle with a 'head-up' display is known. In such a display an image comprising the information to be displayed is generated by an image generation unit. This image is then visually superposed on the environment facing the vehicle, by means of a partial reflection on a semi-transparent strip located in front of the driver, such as a combiner disposed between the windshield of the vehicle and the eyes of the driver.

In order for the information that is thus displayed to be bright enough in order to be properly viewed, without the risk of dazzling the driver, the luminosity of the image thus superposed on the environment outside the vehicle needs to be adapted to the luminosity of said environment, which significantly varies between daytime driving and nighttime driving or driving in a tunnel.

To this end, providing the head-up display with a light sensor is known, with a control unit then controlling the luminosity of the generated image as a function of a signal acquired by the light sensor, so as to adapt the luminosity of this image to an ambient luminosity.

More specifically, mounting a light emitter, which acts as a light source for the image generation unit, on a first printed circuit support plate is known, while the light sensor is mounted on a second printed circuit support plate.

SUBJECT MATTER OF THE INVENTION

In this context, the present invention proposes a display as defined in the introduction, in which the light sensor is mounted on said printed circuit support plate.

This printed circuit support plate then enables the mechanical attachment and the electrical connection both of the at least one light emitter and of the light sensor.

This arrangement advantageously facilitates the manufacture of the display, compared to the aforementioned prior art in particular, since only one assembly operation is then required to install both said emitter (of which there is at least one) and the light sensor. This arrangement is also particularly appealing in terms of manufacturing costs, since it saves the use of one printed circuit support plate as well as the corresponding electrical connection cables.

Provision can be made for the display to also comprise a casing. Said printed circuit support plate is then located in the interior of the casing, particularly in order to be located in the vicinity of the image generation unit. The light sensor is then also located in the interior of the casing.

Provision then can be made for the casing of the display to have an opening traversed by light radiation originating from outside the casing of the display in order to reach the light sensor.

Provision also can be made for the display to further comprise a light guide configured to collect said light radiation so that it can be guided up to the light sensor.

The light guide advantageously ensures effective collection of the light radiation originating from outside the casing and for which the light intensity is measured by the light sensor.

Furthermore, it is preferable that some of the light emitted by said emitter is prevented from reaching said sensor, since this light would disrupt the ambient luminosity measurement carried out by means of this sensor.

By virtue of the light guide, the light intensity originating from said emitter and capable of reaching the light sensor is advantageously reduced.

Furthermore, by virtue of this light guide, the interior of the casing of the display is hidden from a user, whilst ensuring that said light radiation originating from outside the casing reaches the light sensor. This arrangement therefore is particularly appealing in terms of the external appearance of the display, since the interior of the casing is thus hidden from the view of this user.

According to an optional feature of the display, the light guide has an inlet face, in the vicinity of which said light radiation is collected, with this inlet face being located in the vicinity of said opening.

The light guide then prevents foreign bodies, such as dust particles, from entering the interior of the casing of the display, and optimally hides the interior of said casing from the view of a user.

According to another optional feature, the display also comprises an optical projection assembly adapted to project an image generated by the image generation unit toward a semi-transparent strip in order to form, with the semi-transparent strip, a virtual image in the field of view of a user.

Provision then can be made for the light guide to be distinct from the semi-transparent strip. Provision also can be made for the light guide to be separate from the semi-transparent strip.

It is preferable that some of the light emitted by the image generation unit, and subsequently partly reflected onto the semi-transparent strip, is prevented from reaching said sensor, since this light would disrupt the ambient luminosity measurement carried out by means of this sensor.

The fact that the light guide is distinct from the semi-transparent strip then advantageously prevents the light emitted by the light generation unit from reaching the light sensor.

Further non-limiting and advantageous features of the display according to the invention are as follows:

the casing has an outer face and the inlet face of the light guide is located in the vicinity of this outer face;

the casing has an outer face, the casing comprises a channel extending from said outer face toward the interior of the casing for the passage, toward the outside of the casing, of light radiation emitted by the image generation unit, and the inlet face of the light guide is located in the vicinity of a wall of this channel;

said outer face is located, relative to the interior of the casing, on the same side of the casing as the semi-transparent strip in the employed position;

said printed circuit support plate comprises a plate made of thermally conductive material, on which an electrically insulating layer is applied;

the electrically insulating layer is covered, opposite the plate made of thermally conductive material, with a connection layer at least partly formed by an electrically conductive material;

said emitter comprises a light emitting diode;

the display comprises a plurality of emitters;

said emitters are disposed in line on the printed circuit support plate; and the display is adapted so that the luminosity of the generated image is greater, the greater the light intensity received by said sensor.

DETAILED DESCRIPTION OF AN EMBODIMENT

The following description that is provided with reference to the accompanying drawings, which are provided by way of non-limiting examples, will confer an understanding of what the invention consists of and how it can be realized.

Figure 1:
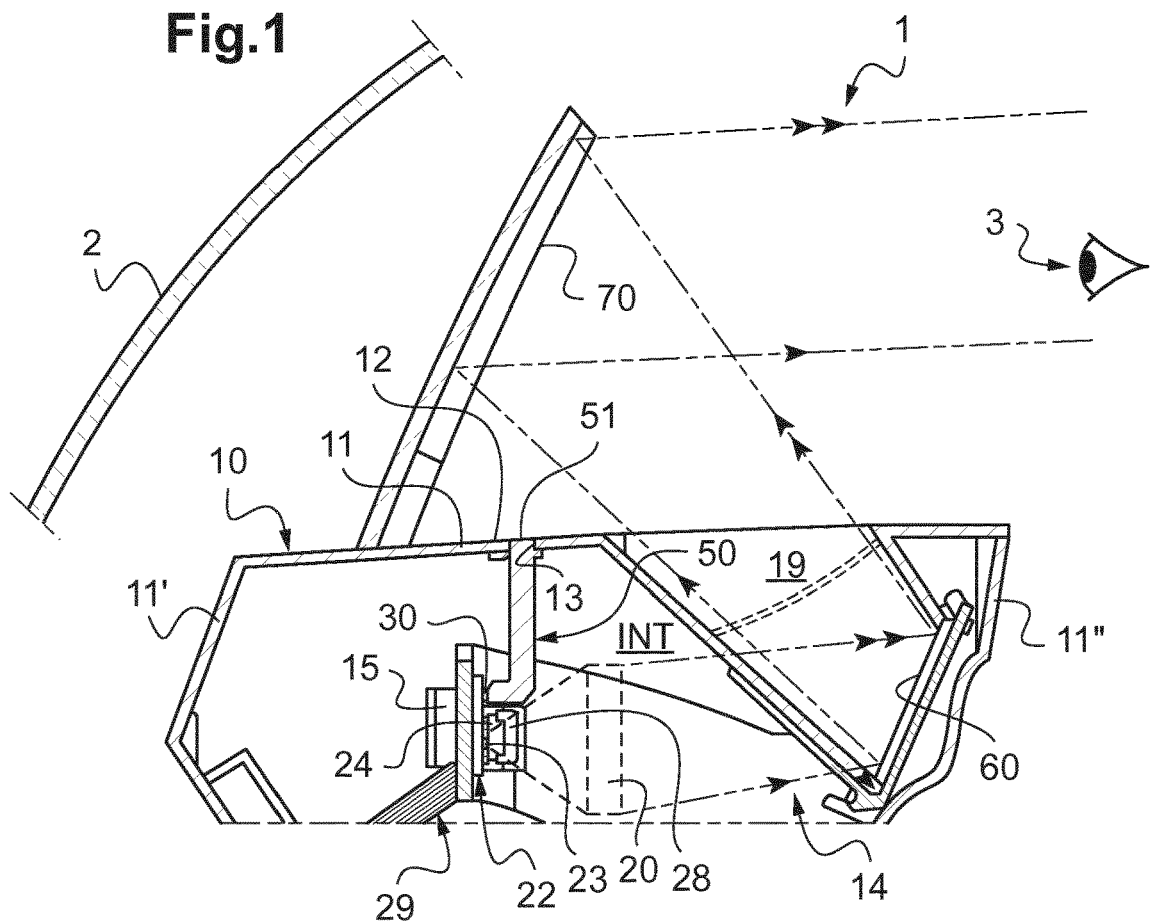
FIG. 1 is a partial schematic section view of a display implementing the teaching of the invention.

FIG. 1 schematically shows the main elements of a display 1, in this case a head-up display, intended to equip a vehicle, for example, a motor vehicle, a train, a boat, such as a barge, a streetcar or a bus.

The display 1 comprises an image generation unit that in this case comprises a screen 20 made up of a plurality of elements, the optical transmission or reflection properties of which can be controlled, such as, for example, a liquid crystal (or LCD 'Liquid Crystal Display') screen with Thin-Film Transistors (TFT).

The display 1 comprises at least one light emitter 23, in this case a plurality of emitters. Each of said light emitters 23, produced by means of a light emitting diode, for example, produces light radiation that is at least partly received through the rear of the screen (in this case made of liquid crystals), which allows an image to be generated.

The display 1 also comprises a printed circuit support plate 22 (schematically shown in FIGS. 1 to 5), on which each of said light emitters 23 is mounted.

Figure 3:
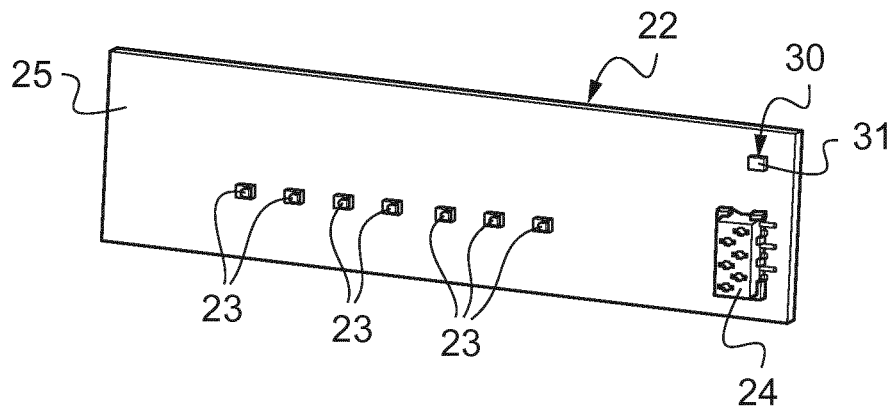
FIG. 3 is a perspective view of a printed circuit support plate of the display of FIG. 1.
Figure 4:
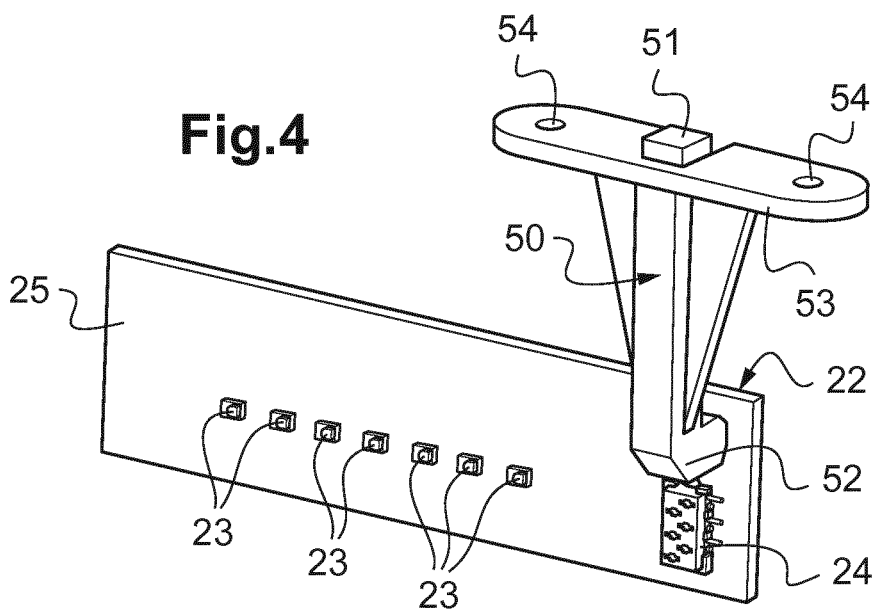
FIG. 4 is a schematic perspective view of the printed circuit support plate of FIG. 3, as well as of a light guide of the display of FIG. 1, showing their positioning in relation to one another.

Provision particularly can be made, as in this case, for said light emitters 23 (mounted on the printed circuit support plate 22) to be disposed in line, along this printed circuit support plate 22 (FIGS. 3 and 4).

Figure 5:
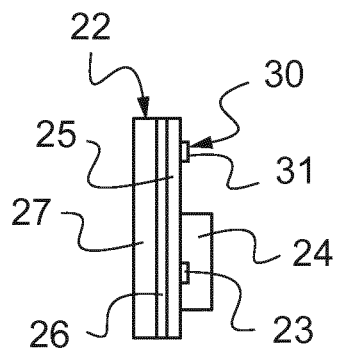
FIG. 5 is a schematic side view of the printed circuit support plate of FIG. 3.

According to one contemplatable embodiment, said support plate 22 comprises, as schematically shown in FIG. 5, a plate 27 made of thermally conductive material, for example, made of metal material, such as aluminum or an aluminum alloy, on which an electrically insulating layer 26, such as a varnish, is applied. The electrically insulating layer 26 is then covered, opposite the plate 27 made of thermally conductive material, with a connection layer 25 at least partly formed by an electrically conductive material, such as a metal or a metal alloy. Each of said light emitters 23 is then soldered onto the connection layer 25.

In this case, said support plate 22 can be produced, for example, by means of a printed circuit support plate of the IMS (Insulated Metal Substrate) type.

By virtue of said plate 27 made of thermally conductive material, the support plate 22 then allows an advantageously effective discharge of thermal energy that is released by said light emitters 23, improving the effectiveness and the operating stability of the image generation unit, as well as its lifetime.

Figure 2:
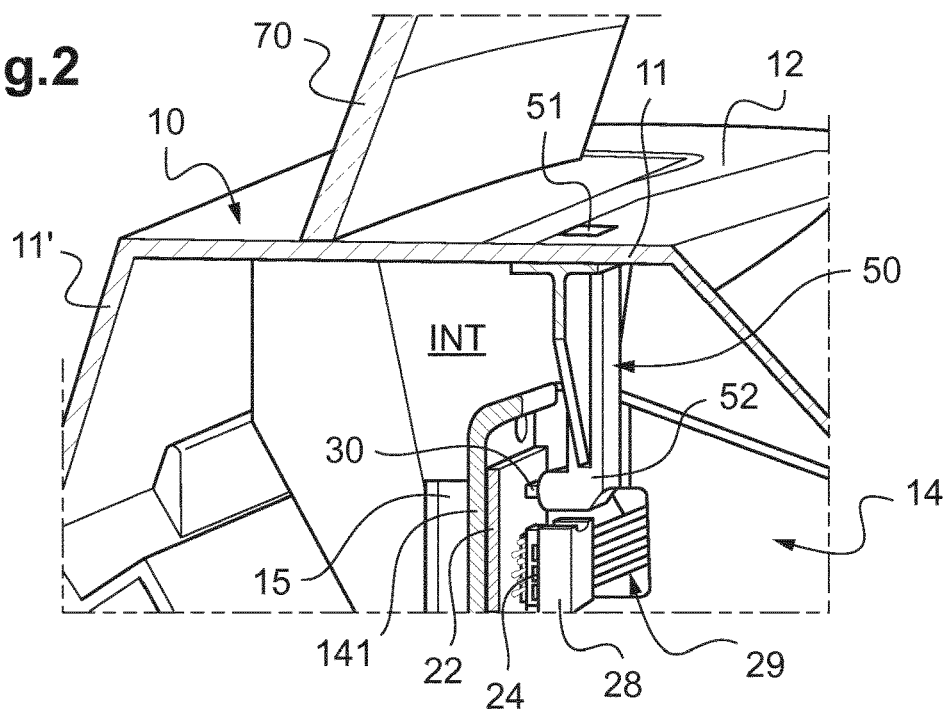
FIG. 2 is another partial schematic perspective view of the display of FIG. 1.

The printed circuit support plate 22 is mounted on a support 14 that allows it to be held in position in the casing 10 of the display 1. This support 14 in this case is formed by a thermally conductive material. More specifically, the plate 27 made of thermally conductive material of said support plate 22 is applied against a wall 141 of this support 14 (FIG. 2). This wall 141 supports, on a face opposite said support plate 22, fins 15 that further improve the discharge of the thermal energy released by said light emitters 23.

A connector 24 is also mounted on the printed circuit support plate 22, by soldering onto the connection layer 25 of said support plate 22.

The display 1 also comprises a control unit (not shown) electrically powering said light emitters 23. This control unit is electrically connected to the printed circuit support plate 22 by means of an electric cable. This electric cable comprises a first connector 28 (FIGS. 1 and 2) and a second connector (not shown) connected by a plurality of conductive wires 29. The first connector 28 of this cable is plugged into the connector 24 mounted on said aforementioned support plate 22.

In a variation, not shown, some electronic components of the control unit can be directly mounted on said printed circuit support plate. Within the scope of this variation, the connector mounted on the aforementioned printed circuit support plate can be used not to connect this support plate to the control unit but, for example, to connect it to an electrical power source or to an electronic module outside the display.

In this case, the display 1 also comprises an optical projection assembly adapted to project the image generated by the image generation unit toward a semi-transparent strip in order to form, with the semi-transparent strip, a virtual image in the field of view of a user.

It is thus possible to display information in the field of view of the user without them having to avert their view. In practice, this user in this case corresponds to the driver of the vehicle.

The optical projection assembly in this case comprises a fold mirror 60. By way of a variation, it can comprise a plurality of mirrors and/or other optical elements.

The semi-transparent strip in this case is implemented in the form of a combiner 70, i.e. a semi-transparent strip, in this case disposed between the windshield 2 of the vehicle and the eyes 3 of the driver.

By way of a variation, provision can be made for the optical projection assembly to directly project the image generated by the image generation unit toward the windshield of the vehicle, with the aforementioned combiner then being omitted. In this case, the semi-transparent strip is thus implemented in the form of the windshield of the vehicle.

The term "semi-transparent strip" herein denotes a strip that is at least partially transparent, having a level of transparency that is between that of a completely transparent strip and that of a completely opaque strip.

In addition to being semi-transparent, this strip is semi-reflective, thus allowing at least part of the light produced by the image generation unit to be returned toward the user, as schematically shown in FIG. 1.

The virtual image, formed in the field of view of the user by the optical projection assembly and the semi-transparent strip, is located opposite the user relative to the semi-transparent strip.

In this case, for the driver of the vehicle, the virtual image is formed within the road environment facing the vehicle, thus visually superposing this environment.

The display 1 also comprises a casing 10, in which the image generation unit and the optical projection assembly are housed.

This casing 10, which is partially shown in FIG. 1, hides the elements of the display 1 that are housed in the casing 10 from the view of the user and protects these elements of the display 1 against foreign bodies, such as dust.

The casing 10 is formed by a plurality of walls 11, 11', 11", in this case optically opaque walls, separating the interior INT of the casing 10 from the exterior thereof.

The casing 10 has an outer face 12, on the side of the semi-transparent strip in the employed position.

More specifically, the semi-transparent strip, in this case the combiner 70, extends, in the employed position, outside the casing 10, projecting relative to this outer face 12, as shown in FIGS. 1 and 2. This outer face 12 in this case is provided by a generally flat upper main wall 11 of the casing 10.

The term "upper" denotes elements, or parts of elements, of the display that are located, relative to the casing 10 (more specifically relative to the interior INT of the casing 10), on the same side of the casing as the semi-transparent strip in the employed position. Such elements, in particular the upper main wall 11, thus can be seen by the user. In the particular case that the display 1 is installed in the vehicle in the vicinity of a dashboard thereof (on a side of the windshield 2 that is opposite a roof of the vehicle), the term "upper" denotes elements, or parts of elements, of the display that are located toward the top of the display 1, relative to an upward vertical direction.

Optionally, provision can be made for the combiner 70 to be movably mounted relative to the casing 10 between its employed position and a retracted position, with the combiner 70 being housed in the casing 10 in its retracted position.

The printed circuit support plate 22 is located in the interior INT of the casing.

In this case, it extends approximately perpendicular to the upper main wall 11 of the casing. Said support plate 22 is disposed, relative to the upper main wall 11 of the casing, opposite the semi-transparent strip. It is also disposed, in this case, so that the aforementioned line of light emitters 23 extends approximately perpendicular to the upper main wall 11 of the casing.

In this case, the display 1 also comprises a channel 19 (FIG. 1) extending from the outer face 12 of the casing toward the interior INT of the casing 10. This channel 19 emerges in the vicinity of the outer face 12 of the casing 10. This channel 19 is intended for the passage of light radiation, which emerges from the screen 20 of the image generation unit and which is returned toward the combiner 70 by the optical projection assembly in order to form the virtual image IMV. This channel 19 particularly prevents parasitic light radiation, other than that which is intended to form the virtual image IMV, from exiting the casing 10 of the display.

The display 1 also comprises a light sensor 30, such as a photodiode or a phototransistor, adapted to deliver a signal representing a light intensity that it receives. The light sensor 30 is disposed so as to receive light radiation originating from outside the display 1.

The display 1 is adapted so that the luminosity of the image generated by the image generation unit is controlled as a function of the signal delivered by the light sensor 30.

The luminosity of the generated image thus can be adapted to an ambient luminosity, measured by means of the sensor 30, which ensures the visibility of the virtual image, even when the ambient luminosity varies.

More specifically, the display 1 in this case is adapted so that the luminosity of the generated image is greater, the greater the light intensity received by said sensor 30.

The luminosity of the generated image in this case is adapted by adjusting the light intensity produced by said light emitters 23 by means of an adaptation of the electrical power supplying them.

In particular, in this case, the control unit (which electrically powers said light emitters 23) is programmed to control the adjustment of this electrical power as a function of the signal delivered by the light sensor 30, so that the luminosity of the generated image is greater, the greater the luminous intensity received by said sensor 30.

By way of a variation, the control unit can be adapted to control the adjustment of this electrical power as a function of an external control signal received by the display, with this external control signal being determined as a function of the signal delivered by the light sensor 30.

According to a particularly noteworthy feature of the display 1, the light sensor 30 is mounted on said printed circuit support plate 22.

This printed circuit support plate 22 then alone enables the mechanical attachment and the electrical connection of said light emitters 23, as well as of the light sensor 30, which is particularly appealing in terms of manufacturing, since a single assembly operation and a single support plate are then required to install both said light emitters 23 (of which there is at least one) and the light sensor 30.

The light sensor 30 in this case is soldered onto the connection layer 25 of said support plate 22.

The aforementioned electric cable, which connects the support plate 22 to the control unit, is adapted to transmit the signal delivered by the light sensor 30 to the control unit.

The light sensor 30 has a sensitive surface 31 (in the vicinity of which the receiver 30 receives said light intensity), which in this case extends approximately parallel to the printed circuit support plate 22. The sensitive surface 31 (FIG. 3) of the sensor 30 therefore in this case is approximately perpendicular to the upper main wall 11 of the display 1.

The casing 10 in this case has an opening 13 (FIG. 1) traversed by the light radiation originating from outside the casing 10 of the display 1 in order to reach the light sensor 30. This opening 13, in this case is arranged through said upper main wall 11 of the casing 10 and thus emerges on said outer face 12 thereof.

By way of a further variation, the orientation of the sensitive surface of the light sensor can differ from that described above. This sensitive surface can extend, for example, substantially parallel to the wall in which said opening is arranged.

The display 1 also can comprise, as in this case, a light guide 50 that is configured to collect said light radiation and to guide it up to the light sensor 30.

By virtue of the light guide 50, the light sensor 30 can be positioned on said printed circuit support plate 22 (in the interior INT of the casing 10), with the aforementioned advantages that this involves, whilst mainly and effectively receiving said light radiation originating from outside the casing 10 of the display 1.

Furthermore, by virtue of this light guide 50, the interior INT of the casing 10 of the display 1 is hidden from a user, which improves its external appearance.

By way of a variation, the light guide nevertheless can be omitted. Within the scope of this variation, provision can be made for said opening to be arranged in line with the sensitive surface of the light sensor, with this sensitive surface being, for example, substantially parallel to the wall in which the opening is arranged.

The light guide 50 in this case has an inlet face 51, in the vicinity of which said light radiation is collected. This inlet face 51 is located in the vicinity of said opening 13. More specifically, as can be seen in FIG. 2, the inlet face 51 of the light guide 50 in this case is flush with the outer face 12 on which this opening 13 emerges.

By way of a variation, instead of being arranged in the vicinity of the upper main wall of the casing, said opening can be arranged in the vicinity of another wall of the casing. In particular, this opening can be arranged in the vicinity of a wall forming the aforementioned channel (which is provided for the passage, toward the outside of the casing, of the light radiation emerging from the liquid crystal screen). According to this variation, the inlet face of the light guide is then located in the vicinity of this wall of the channel.

The light guide 50 in this case is distinct and separate from the semi-transparent strip. This prevents the light emitted by the image generation unit, and which passes through the semi-transparent strip or is reflected thereby, from reaching the light sensor 30. This arrangement is particularly appealing, since if some of the light emitted by the image generation unit reached the light sensor 30, this would disrupt the measurement of ambient luminosity carried out by means of this sensor 30.

The light guide 50 in this case is of generally elongated shape, with an approximately even section (in this case rectangular), extending from the inlet face 51 of the light guide up to an outlet face of the light guide located opposite the sensitive surface 31 of the light sensor 30 (FIG. 4).

The light guide 50 is formed by a transparent material, for example, a transparent plastic material such as transparent polycarbonate or transparent poly(methyl methacrylate) (or PMMA).

Said light radiation collected in the vicinity of the inlet face 51 is guided up to the outlet face, particularly by complete internal reflection in the vicinity of the external lateral surfaces of the light guide 50.

The light guide 50 in this case has an elbow 52, in this case substantially at a right angle, allowing said light radiation to be redirected toward the sensitive surface 31 of the light sensor 30.

The light guide 50 also has, in this case, on the side of its inlet face 51, a base plate 53. This base plate 53 is attached on the inner side of the wall (in this case said upper main wall 11) of the casing in which said opening 53 is arranged. This attachment in this case is carried out by means of attachment components such as screws, passing through holes 54 made in this base plate 53.

By way of a variation, instead of being attached to the casing, the light guide can be attached to said printed circuit support plate, or even can be attached both to the casing and to said printed circuit support plate.

The shape of the light guide 50 particularly depends on the position of said opening 13 relative to the printed circuit support plate 22, since the light guide 50 optically connects this opening 13 to the light sensor 30 mounted on this support plate.

Thus, provision can be made, by way of a variation, for the light guide to have a detailed shape different from that previously described, particularly when said opening is located, on the casing, in a different position than that described above.

The invention claimed is:

1. A display comprising:
   an image generation unit comprising at least one light emitter configured to be a light source for the image generation unit;
   a printed circuit support plate, on which said emitter is mounted; and
   a light sensor that delivers a signal representing a light intensity received thereby,
   wherein the display is adapted so that a luminosity of an image generated by the image generation unit is controlled as a function of said signal,
   wherein the printed circuit support plate comprises a plate made of thermally conductive material, on which an electrically insulating layer is applied, the electrically insulating layer being covered, opposite the plate made of thermally conductive material, with a connection layer at least partly formed by an electrically conductive material,
   wherein the emitter and the light sensor are mounted on the connection layer, and
   wherein the light sensor is mounted on said printed circuit support plate.

2. The display as claimed in claim 1, further comprising a casing, said printed circuit support plate being located in an interior of the casing, the casing having an opening traversed by light radiation originating from outside the casing of the display in order to reach the light sensor.

3. The display as claimed in claim 2, further comprising a light guide configured to collect said light radiation so that it can be guided up to the light sensor.

4. The display as claimed in claim 3, wherein the light guide has an inlet face, in a vicinity of which said light radiation is collected, the inlet face of the light guide being located in the vicinity of said opening.

5. The display as claimed in claim 4, wherein the casing has an outer face, the inlet face of the light guide being located in the vicinity of said outer face.

6. The display as claimed in claim 4, wherein the casing has an outer face, the casing comprises a channel extending from said outer face toward the interior of the casing for the passage, toward an outside of the casing, of the light radiation emitted by the image generation unit, the inlet face of the light guide being located in the vicinity of a wall of this channel.

7. The display as claimed in claim 6, comprising an optical projection assembly adapted to project the image generated by the image generation unit toward a semi-transparent strip, in order to form, with the semi-transparent strip, the image in a field of view of a user.

8. The display as claimed in claim 7, wherein the light guide is distinct from the semi-transparent strip.

9. The display as claimed in claim 7, wherein said outer face is located, relative to the interior of the casing, on a same side of the casing as the semi-transparent strip in an employed position.

10. The display as claimed in claim 1, wherein said emitter comprises a light emitting diode.

11. The display as claimed in claim 1, comprising a plurality of emitters disposed in line on the printed circuit support plate.

12. The display as claimed in claim 1, adapted so that the luminosity of the generated image is greater, the greater than the light intensity received by said sensor.

* * * * *